United States Patent
Qi et al.

(10) Patent No.: US 10,505,036 B2
(45) Date of Patent: Dec. 10, 2019

(54) LATERAL DIFFUSED METAL OXIDE SEMICONDUCTOR FIELD EFFECT TRANSISTOR

(71) Applicant: CSMC TECHNOLOGIES FAB2 CO., LTD., Wuxi New District (CN)

(72) Inventors: Shukun Qi, Wuxi New District (CN); Guipeng Sun, Wuxi New District (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 0 days.

(21) Appl. No.: 15/779,666

(22) PCT Filed: Aug. 25, 2016

(86) PCT No.: PCT/CN2016/096730
§ 371 (c)(1),
(2) Date: May 29, 2018

(87) PCT Pub. No.: WO2017/092419
PCT Pub. Date: Jun. 8, 2017

(65) Prior Publication Data
US 2018/0342609 A1 Nov. 29, 2018

(30) Foreign Application Priority Data
Nov. 30, 2015 (CN) .......................... 2015 1 0864548

(51) Int. Cl.
*H01L 29/78* (2006.01)
*H01L 29/08* (2006.01)
(Continued)

(52) U.S. Cl.
CPC ...... *H01L 29/7816* (2013.01); *H01L 29/0619* (2013.01); *H01L 29/0865* (2013.01);
(Continued)

(58) Field of Classification Search
CPC ............. H01L 29/0865; H01L 29/0882; H01L 29/4983; H01L 29/7816; H01L 29/0619;
(Continued)

(56) References Cited

U.S. PATENT DOCUMENTS 6,873,011 B1 3/2005 Huang et al.
8,058,129 B2 11/2011 Lee
(Continued)

FOREIGN PATENT DOCUMENTS

CN 1886839 A 12/2006
CN 101740625 A 6/2010
(Continued)

OTHER PUBLICATIONS

Chinese Office Action for Chinese Counterpart Application No. 201510864548.5, dated Sep. 29, 2018 (8 pages).
(Continued)

*Primary Examiner* — Savitri Mulpuri
(74) *Attorney, Agent, or Firm* — Kagan Binder, PLLC

(57) ABSTRACT

A lateral diffused metal oxide semiconductor field effect transistor, comprising a substrate, a gate, a source, a drain, a body region, a field oxide region between the source and drain, and a first well region and second well region on the substrate. The second well region below the gate is provided with a plurality of gate doped regions, and a polycrystalline silicon gate of the gate is a multi-segment structure, each segment being separated from the others, with each gate doped region being disposed below the spaces between each segment of the polycrystalline silicon gate. Each of the gate doped regions is electrically connected to the segment that is in a direction nearest the source from among the two polycrystalline silicon gate segments on either side thereof.

10 Claims, 2 Drawing Sheets

(51) Int. Cl.
    *H01L 29/49*     (2006.01)
    *H01L 29/40*     (2006.01)
    *H01L 29/423*    (2006.01)
    *H01L 29/06*     (2006.01)

(52) U.S. Cl.
    CPC ........ *H01L 29/0882* (2013.01); *H01L 29/404* (2013.01); *H01L 29/4238* (2013.01); *H01L 29/4983* (2013.01); *H01L 29/7835* (2013.01); *H01L 29/42368* (2013.01)

(58) Field of Classification Search
    CPC .............. H01L 29/4238; H01L 29/7835; H01L 29/404; H01L 29/42368
    See application file for complete search history.

(56) References Cited

U.S. PATENT DOCUMENTS

| | | | |
|---|---|---|---|
| 8,598,658 B2 | 12/2013 | Fang et al. |
| 8,610,206 B2 | 12/2013 | Chu et al. |
| 9,620,615 B2 | 4/2017 | Deng et al. |
| 9,673,193 B2 | 6/2017 | Zhang et al. |
| 9,862,595 B2 | 1/2018 | Jing |
| 9,947,785 B2 | 4/2018 | Han et al. |
| 9,952,609 B2 | 4/2018 | Zhang et al. |
| 9,953,970 B2 | 4/2018 | Zhang et al. |
| 9,954,074 B2 | 4/2018 | Zhong et al. |
| 9,975,766 B2 | 5/2018 | Hu et al. |
| 9,977,342 B2 | 5/2018 | Yao |
| 10,014,392 B2 | 7/2018 | Qi et al. |
| 10,101,225 B2 | 10/2018 | Qian |
| 2010/0032712 A1 | 2/2010 | Udrea et al. |
| 2010/0301403 A1 | 12/2010 | Min et al. |
| 2015/0061008 A1 | 3/2015 | McGregor et al. |
| 2016/0204192 A1 | 7/2016 | Abiko et al. |
| 2016/0233216 A1 | 8/2016 | Zhang et al. |
| 2017/0011144 A1 | 1/2017 | Hu et al. |
| 2017/0011957 A1 | 1/2017 | Wang et al. |
| 2017/0205470 A1 | 7/2017 | Li et al. |
| 2018/0130877 A1 | 5/2018 | Huang et al. |
| 2018/0139544 A1 | 5/2018 | Hu |
| 2018/0252996 A1 | 9/2018 | Wan et al. |
| 2018/0358390 A1 | 12/2018 | Liu et al. |

FOREIGN PATENT DOCUMENTS

| | | |
|---|---|---|
| CN | 101969074 A | 2/2011 |
| CN | 102117807 A | 7/2011 |
| CN | 105789306 A | 7/2016 |

OTHER PUBLICATIONS

Internation Search Report and English Translation thereof for International Application no. PCT/CN2016/096730, dated Nov. 28, 2016 (4 pages).
Unpublished Utility U.S. Appl. No. 15/770,624, filed Apr. 24, 2018 (14 pages).
Unpublished Utility U.S. Appl. No. 16/305,119, filed Nov. 28, 2018 (31 pages).
European Office Action for European Application No. 16869730.8, dated Jun. 25, 2019 (8 pages).

LATERAL DIFFUSED METAL OXIDE SEMICONDUCTOR FIELD EFFECT TRANSISTOR

TECHNICAL FIELD

The present disclosure relates to semiconductor technologies, and more particularly relates to a laterally diffused metal-oxide-semiconductor field-effect transistor having a RESURF structure.

BACKGROUND

The basic structure using RESURF (reduced surface field) principle consists of a low-doped P-type substrate and a low-doped N-type epitaxial layer. A P well is formed on the epitaxial layer and N+, P+ are implanted into the P well, such that a transverse P-well/N-epi junction and a longitudinal P-sub/N-epi junction are formed. Due to a higher doping concentration at both ends of the transverse junction, the breakdown voltage of the transverse junction is lower than that of the longitudinal junction. The basic principle of RESURF is to enable the epitaxial layer to be completely depleted before the transverse junction reaches the critical avalanche breakdown field by using the interaction of the transverse junction and the longitudinal junction. By reasonably optimizing the device parameters, the breakdown of the device occurs in the longitudinal junction, thereby playing a role in reducing the surface field.

In order to improve an on-resistance Rsp, the conventional laterally diffused metal-oxide-semiconductor field-effect transistor (LDMOSFET) having a RESURF structure mainly adjusts the impurity concentration of a drift region while satisfying the RESURF requirement. However, due to the inverse relationship between doping concentration and off-state breakdown, improving the on-resistance only by improving the resistance Rdr of the drift region has its limitations.

SUMMARY

Accordingly, it is necessary to provide a laterally diffused metal-oxide-semiconductor field-effect transistor having a lower on-resistance.

A laterally diffused metal-oxide-semiconductor field-effect transistor includes a substrate, a gate, a source, a drain, a body region, a field oxide region located between the source and the drain, and a first well region and a second well region formed on the substrate. The first well region is of a first-conductivity type, and the second well region is of a second-conductivity type. The first-conductivity type and the second-conductivity type are opposite conductivity types. The source and the body region are disposed in the second well region, and the drain is disposed in the first well region. The second well region below the gate is provided with a plurality of gate doped regions of the first-conductivity type therein. A polysilicon gate of the gate has a multi-segment structure, the segments are separated from one another. Each of the gate doped regions is disposed below a gap between two segments of the polysilicon gates. Each of the gate doped regions is electrically coupled to a segment of the polysilicon gate adjacent to the source (either directly contact or via a metal wiring layer), which is one of the two segments of the polysilicon gates located at both sides of the gate doped region, such that the potential of each of the gate doped regions is equal to that of the gate.

In the aforementioned laterally diffused metal-oxide-semiconductor field-effect transistor, the number of channel electrons increases, and electrons are accelerated for several times during flowing from the source to the drain, which is equivalent to an increase in the channel electric field and the channel current. Therefore, the channel resistance is reduced, thereby reducing the on-resistance. Meanwhile, since the reduction of the channel resistance helps to improve the optimization space of a drift region, the concentration of the drift region can be further reduced, thereby improving the withstand voltage (breakdown voltage) of the device. Alternatively, the length of the drift region can be further shortened while keeping the withstand voltage constant, thereby reducing the cost.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

Unless otherwise defined, all terms (including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The term "and/or" as used herein includes any and all combinations of one or more of the associated listed items.

The semiconductor vocabularies used herein are technical terms commonly used by those skilled in the art. For example, with respect to P-type and N-type impurities, in order to distinguish the doping concentration, a P+ type simply represents a P-type with heavily doped concentration, a P type represents a P-type with medium doped concentration, and a P-type represents a P-type with lightly doped concentration. An N+ type represents an N-type with heavily doped concentration, an N type represents an N-type with medium doped concentration, and an N-type represents an N-type with lightly doped concentration.

Figure 1:
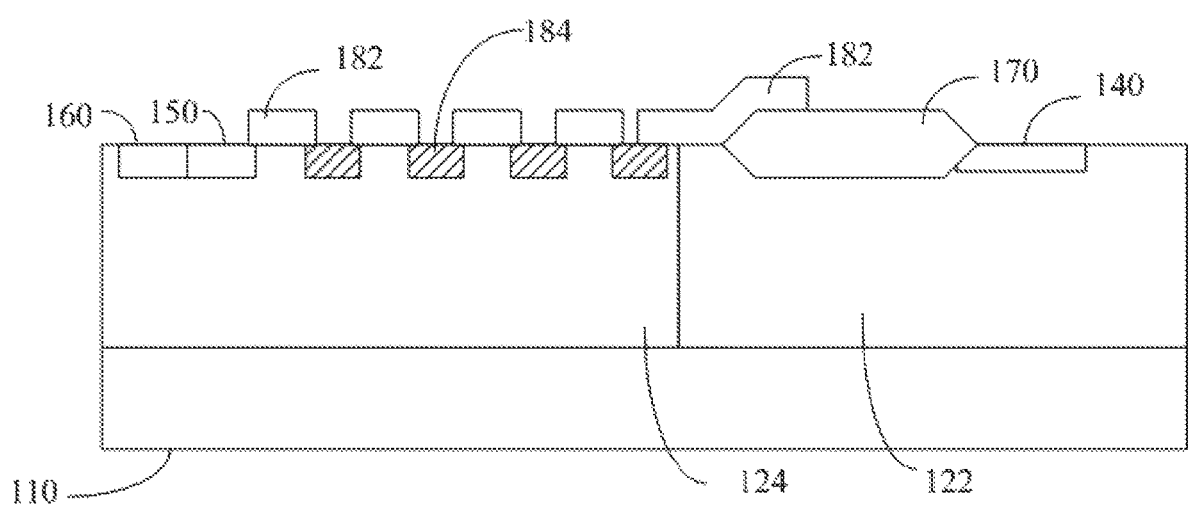
FIG. 1 is a schematic view of a laterally diffused metal-oxide-semiconductor field-effect transistor according to one embodiment.

FIG. 1 is a schematic view of a laterally diffused metal-oxide-semiconductor field-effect transistor according to one embodiment, which includes a P-type substrate 110, an N well 122, a P well 124, an N+ source 150 and a P+ body region 160 located in the P well 124, an N+ drain 140 in the N well 122, a gate doped region 184 in the P well 124, and a field oxide region 170 located between the source 150 and the drain 140. A polysilicon gate 182 has a multi-segments structure. A segment of the polysilicon gate 182 which is closest to the drain 140 extends to the field oxide region 170 to serve as a polycrystalline field plate. One end of a segment of the polysilicon gate 182 which is closest to the source 150 extends to the source 150. In the illustrated embodiment, a first-conductivity type is N-type, and a second-conductivity type is P-type. In alternative embodiments, the first-conductivity type may be P-type, and the second-conductivity type is N-type.

When the aforementioned laterally diffused metal-oxide-semiconductor field-effect transistor is in an on-state, electrons are implanted from the source 150 into a channel below the gate (a sub-channel below the leftmost segment of the polysilicon gate 182 in FIG. 1). Due to the potential difference between the gate and source 150, a high electric field is formed to accelerate the channel electrons to enter the leftmost one of the gate doped regions 184 in FIG. 1. Afterwards, the electrons continue to move towards the drain 140 and enter the second sub-channel (the channel below the second segment of the polysilicon gate 182 from the left in FIG. 1), and are likewise accelerated by the gate doped region 184 on the right side of the channel. Similarly, the electrons are continuously accelerated between the adjacent two gate doped regions 184 during the movement from the source 150 towards the drain 130.

In one embodiment, LDMOSFET further includes a metal wiring layer. Referring to FIG. 1, in the illustrated embodiment, metal electrodes are provided in a gap between two segments of the polysilicon gate 182 above each of the gate doped regions 184 to form the metal wiring layer. Each of the gate doped regions 184 is electrically coupled to the segment of the polysilicon gate 182 on the left side thereof via the metal wiring layer (not shown in FIG. 1), thus ensuring that the sub-channel formed by each segment of the polysilicon gates 182 operates in a saturation region, so as to provide a high carrier mobility under high electric field.

More gate doped regions 184 can be provided to help to further reduce the on-resistance. However, it should be understood that, in case that the device width is constant, the more gate doping regions 184 are provided in a width direction, the smaller width and the interval of each of the gate doping regions 184. Thus, under the circumstances that the manufacturing accuracy is not sufficiently high, the doped regions 184 separated from each other in the design may be connected with each other in one piece during manufacturing, which may lose the effect of RESURF and have an adverse effect on the breakdown voltage BV of the device. Therefore, in one embodiment, the LDMOSFET is provided with 3 to 5 sets of the gate doped regions 184 in a connection direction between the source and the drain. In the illustrated embodiment, referring to FIG. 1, four sets of the gate doped regions 184 are provided.

Figure 2:
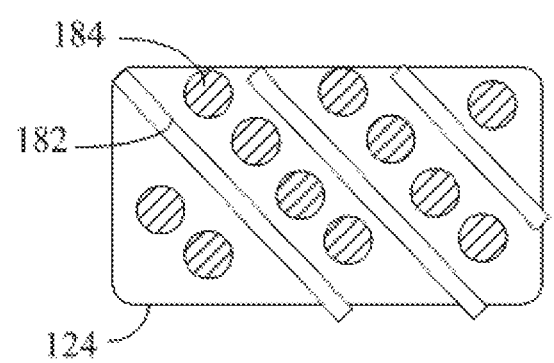
FIG. 2 is a partial, top plan view of the laterally diffused metal-oxide-semiconductor field-effect transistor of FIG. 1.

In one embodiment, each set of the gate doped regions 184 includes a plurality of gate doped regions. Referring to FIG. 2, each of the gate doped regions 184 in each set is arranged in a direction perpendicular to a channel current between the source 150 and the drain 140. FIG. 2 is a top plan view showing that the direction of the channel current between the source 150 and the drain 140 (i.e., the connection direction between the source 150 and the drain 140) is the X axis, and the height direction of the device is the Z axis to establish a space rectangular coordinate system. The plurality of gate doping regions 184 are provided not only in the X-axis direction but also in the Y-axis direction (or in a direction at a certain angle to the Y-axis on the XY plane). Compared to one piece of (i.e., single) gate doped region structure, this configuration is more conducive to achieving charge balance between the P-well 124 and the gate doped region 184, while improving the redundancy of the implantation process, such that a small deviation of implantation dose does not cause a large withstand voltage fluctuation. The structure can also ensure a maximum current path and reduce the on-resistance of the P well 124. At the same time, these gate doped regions 184 can assist in depleting the P well 124, thereby improving the withstand voltage of the device.

In one embodiment, an interval between the adjacent gate doped regions 184 in the connection direction between the source 150 and the drain 140 is less than or equal to 0.8 μm. By this way, the gate doped regions 184 are not connected with each other during manufacturing, and a better effect of reducing the on-resistance can also be obtained. Correspondingly, each of the gate doped regions 184 has a width (i.e., a dimension in the connection direction between the source 150 and the drain 140) of 1 μm to 2.5 μm.

In one embodiment, the gate doped region 184 has an implantation dose of 0.8 E13/cm$^2$ to 1.5 E13/cm$^2$, a junction depth of about 0.8 μm, and a peak concentration of 1.0 E17/cm$^3$ to 2.0 E17/cm$^3$. Under the aforementioned conditions, the device can reach a minimum breakdown voltage of approximately 600 V.

Compared to the conventional structure, the number of channel electrons of the aforementioned LDMOSFET is increased, and electrons are accelerated for several times during flowing from the source to the drain, which is equivalent to an increase in the channel electric field and the channel current. Therefore, the channel resistance is reduced, thereby reducing the on-resistance. Meanwhile, the reduction of the channel resistance helps to improve the optimization space of a drift region, and the concentration of the drift region can be further reduced, thereby improving the withstand voltage (breakdown voltage) of the device. Alternatively, the length of the drift region can be further shortened while keeping the withstand voltage constant, thereby reducing the device cost.

Although the description is illustrated and described herein with reference to certain embodiments, the description is not intended to be limited to the details shown. Modifications may be made in the details within the scope and range equivalents of the claims.

What is claimed is:

1. A laterally diffused metal-oxide-semiconductor field-effect transistor, comprising:

a substrate, a gate, a source, a drain, a body region, a field oxide region located between the source and the drain, and a first well region and a second well region formed on the substrate, wherein the first well region is of a first-conductivity type, the second well region is of a second-conductivity type, the first-conductivity type and the second-conductivity type are opposite conductivity types;

the source and the body region are disposed in the second well region, the drain is disposed in the first well region;

the second well region below the gate is provided with a plurality of gate doped regions of the first-conductivity type therein, wherein a first direction is perpendicular to a second direction that is defined by a connection direction between the source and the drain, and the plurality of gate doped regions are provided along a third direction at an angle to the first direction, a polysilicon gate of the gate has a multi-segment structure, the segments are separated from one another, each of the gate doped regions is disposed below a gap between two segments of the polysilicon gate, each of the gate doped regions is electrically coupled via a metal wiring layer to a segment of the polysilicon gate adjacent to the source, wherein the segment is one of the two segments of the polysilicon gate located at both sides of the gate doped region, wherein a segment of the polysilicon gate of the gate extends to the field oxide region, wherein each adjacent two segments of the polysilicon gate are further provided with the plurality of gate doped regions in the first direction, and wherein the first direction is an X-axis and the second direction is a Y-axis, and wherein the third direction is provided in a direction at a certain angle to the Y-axis on an XY plane formed by the X-axis and the Y-axis.

2. The laterally diffused metal-oxide-semiconductor field-effect transistor according to claim 1, wherein an interval between adjacent gate doped regions in the second direction is less than or equal to 0.8 μm.

3. The laterally diffused metal-oxide-semiconductor field-effect transistor according to claim 1, wherein 3 to 5 sets of the gate doped regions are provided in the second direction, each set of the gate doped regions comprises at least one gate doped region.

4. The laterally diffused metal-oxide-semiconductor field-effect transistor according to claim 3, wherein each set of the gate doped region comprises a plurality of gate doped regions, each of the gate doped regions in each set is arranged in the first direction.

5. The laterally diffused metal-oxide-semiconductor field-effect transistor according to claim 3, wherein each of the gate doped regions has a width of 1 μm to 2.5 μm.

6. The laterally diffused metal-oxide-semiconductor field-effect transistor according to claim 1, wherein each of the gate doped regions has a peak concentration of $1.0\ E17/cm3$ to $2.0\ E17/cm3$.

7. The laterally diffused metal-oxide-semiconductor field-effect transistor according to claim 6, wherein each of the gate doped regions has an implantation dose of $0.8\ E13/cm2$ to $1.5\ E13/cm2$.

8. The laterally diffused metal-oxide-semiconductor field-effect transistor according to claim 6, wherein each of the gate doped regions has a junction depth of 0.8 μm.

9. The laterally diffused metal-oxide-semiconductor field-effect transistor according to claim 1, wherein the first-conductivity type is N-type, and the second-conductivity type is P-type.

10. The laterally diffused metal-oxide-semiconductor field-effect transistor according to claim 1, wherein the connection direction is a direction of a channel current between the source and drain.

* * * * *